United States Patent [19]

Cohen et al.

[11] 3,883,390

[45] May 13, 1975

[54] PROCESS AND APPARATUS FOR DELAMINATING AN ADHERENT RECEPTOR SHEET ON A SENSITIZED ELEMENT

[75] Inventors: Abraham B. Cohen, Springfield; Herbert A. Tobias, East Brunswick, both of N.J.

[73] Assignee: E. I. du Pont de Nemours and Company, Wilmington, Del.

[22] Filed: Aug. 30, 1973

[21] Appl. No.: 393,053

Related U.S. Application Data

[62] Division of Ser. No. 201,414, Nov. 23, 1971, Pat. No. 3,794,546.

[52] U.S. Cl. .............................................. 156/584

[51] Int. Cl. .......................................... B32b 31/08

[58] Field of Search ........... 156/552, 555, 584, 540

[56] References Cited

UNITED STATES PATENTS

| | | | |
|---|---|---|---|
| 162,892 | 5/1975 | Braidwood | 156/540 |
| 3,415,706 | 12/1968 | Ettre | 156/584 |
| 3,453,169 | 7/1969 | Buck et al. | 156/552 |
| 3,623,933 | 11/1971 | Staats | 156/552 |

*Primary Examiner*—Douglas J. Drummond

[57] ABSTRACT

A process and apparatus for image reproduction using a discrete laminated sensitized element comprising a substrate, a resist layer and a receptor sheet, in which a continuous web is adhered to the receptor sheet and then taken up to delaminate the receptor sheet from the sensitized element leaving the hardened or unhardened portion of the resist layer adhering to the substrate as a positive or negative reproduction of the image and the complementary unhardened or hardened image adhering to the receptor sheet.

6 Claims, 12 Drawing Figures

PROCESS AND APPARATUS FOR DELAMINATING AN ADHERENT RECEPTOR SHEET ON A SENSITIZED ELEMENT

This is a divisional of application Ser. No. 201,414, filed on Nov. 23, 1971, now U.S. Pat. No. 3,794,546.

BACKGROUND OF THE INVENTION

1. Field of the Invention

This invention relates to image reproduction processes and apparatus, and particularly to image reproduction processes and apparatus using photohardenable material as the image reproducing medium.

2. Description of the Prior Art

Assignee's copending U.S. Pat. No. 3,771,871 and U.S. Pat. No. 3,687,552 describe integrated apparatus for preparing resist images on a series of articles, having means for continuously delaminating an integral receptor sheet from sensitized elements.

The present invention provides a process and apparatus for discrete delamination of an integral receptor sheet from individual exposed sensitized elements.

SUMMARY OF THE INVENTION

The present invention is a process and apparatus for delaminating at least one receptor sheet from a discrete, integral, sensitized element which comprises a substrate, a resist layer and the receptor sheet. The process comprises a. supplying a continuous web to an adhering means for adhering the continuous web to at least the leading edge of the receptor sheet;

b. feeding the sensitized element to the adhering means;

c. adhering the continuous web to the receptor sheet by pressing the continuous web against the receptor sheet; and d. taking up the continuous web, after it has been adhered to the receptor sheet, to delaminate the receptor sheet from the sensitized element.

The apparatus comprises means to accomplish the above process. In the preferred embodiment, the adhering means comprises a pair of nip rolls for compressing the sensitized element and the continuous web together. The adhering means may be in the form of fixed rods or shoes and may contain heating elements in the case where the continuous web is adhered to the receptor sheet by a thermal adhesive. The apparatus may also be provided with a heating chamber or heating platens for heating the sensitized element in accordance with the processes of Assignee's U.S. Pat. No. 3,607,264, where, on imagewise exposure to actinic radiation, a photohardenable composition forms hardened and unhardened areas and delamination of the integral receptor sheet above 45°C. causes the unhardened areas of the composition to fail cohesively in a horizontal plane leaving a substantial amount of the unhardened material adhering to the element as negative reproduction of the image and the complementary hardened material and remaining portions of the unhardened material adhering to the integral receptor sheet.

The process and apparatus are also useful for practicing the process of Assignee's patent application Ser. No. 78,180 filed Oct. 5, 1970, where, on imagewise exposure to actinic radiation and delamination of the receptor sheet, the hardened areas of the photohardenable material adhere to the sensitized element, which has a higher chemical affinity for or adhesion to the imagewise exposed hardened areas of the photohardenable material, as a positive reproduction of the image, and the complementary unhardened material adheres to the receptor sheet.

BRIEF DESCRIPTION OF THE DRAWINGS

Apparatus embodying the invention are described herein with reference to the attached drawings, wherein the same numbers are used throughout, in which.

DESCRIPTION OF THE PREFERRED EMBODIMENT

In the embodiment of the invention illustrated in the attached drawing a sensitized element D: comprising a substrate B (which can be, for example, a copper plated, glass fibre, laminated board such as used for the manufacture of printed circuits), at least one laminated resist layer R; and at least one integral, adherent receptor sheet S; is prepared and exposed according to the process of Assignee's aforementioned U.S. Pat. No. 3,607,264, the disclosure of which is hereby incorporated by reference herein. While in the embodiment illustrated, the sensitized element is shown with a resist layer and receptor sheet on both sides of the substrate, the present process and apparatus are also useful in conjunction with a sensitized element having only one resist layer and receptor sheet.

Figures 3, 5:
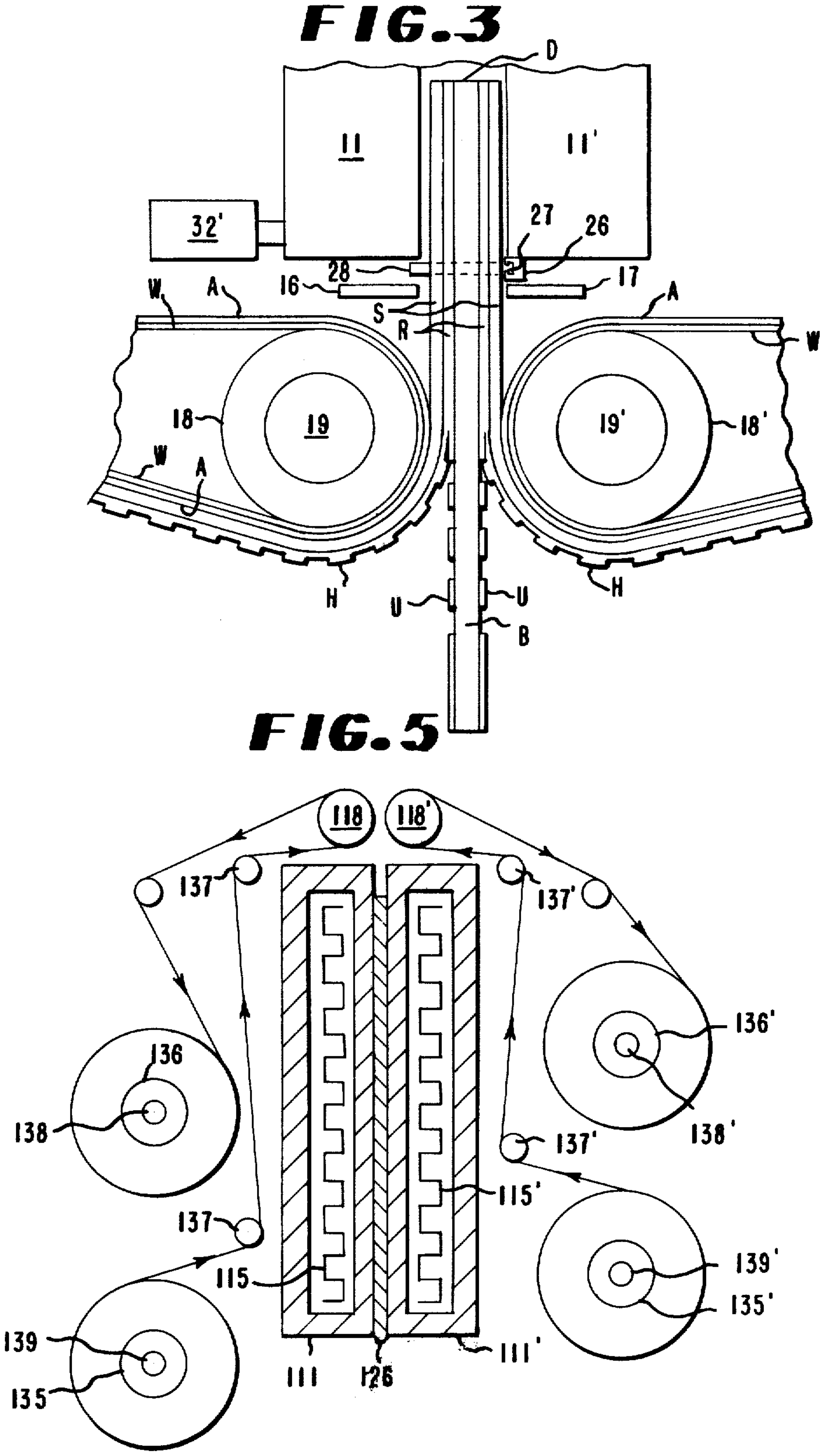
FIG. 3 is a detail drawing of a portion of the section shown in FIG. 2.
FIG. 5 is a side view of the embodiment of the invention of FIG. 4 in section taken along lines 5–5 in FIG. 4.
Figure 6:
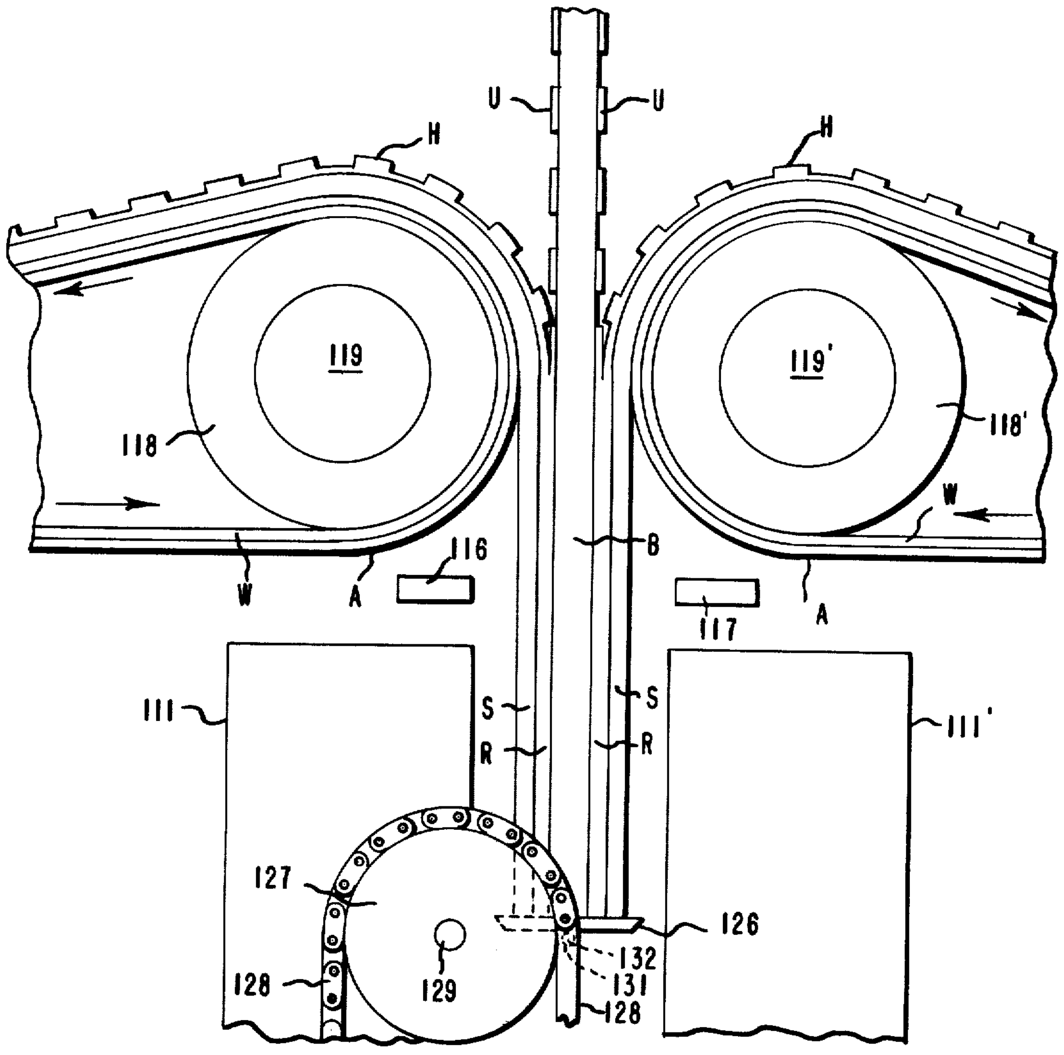
FIG. 6 is a detail drawing of a portion of the section shown in FIG. 4.

In operation, a continuous web W having an adhesive layer A which may be continuous, as shown in FIG. 6, discrete as shown in FIG. 3, or foraminous, is brought into contact with and adhered to the receptor sheet S on the sensitized element. The continuous web W and integral receptor sheet are taken-up, whereby the receptor sheet S is delaminated from the sensitized element, causing the unhardened areas of the resist layer R to fail cohesively leaving the unhardened material U adhering to the substrate B, and the hardened material H adhering to the integral receptor sheet S along with portions of the unhardened material which separate from the unhardened material adhering to the substrate by cohesive failure.

Although the embodiment of the invention is described and shown with particular reference to the process of Assignee's U.S. Pat. No. 3,607,264, it is equally suitable for practicing the process of Assignee's aforementioned patent application Ser. No. 78,180, which is incorporated by reference herein.

Although it is preferred to deposit the adhesive A on the continuous web W, it may alternatively be deposited on the surface of the receptor sheet which is to be brought in contact with the web. If the adhesive material is deposited on the receptor sheet, it is only necessary to deposit a strip of adhesive material along the leading edge of the receptor sheet.

Figure 1A:
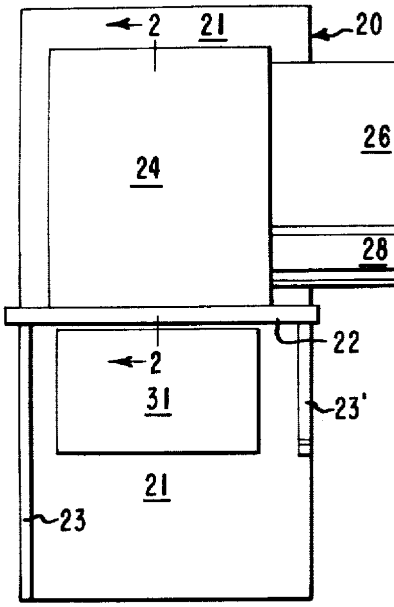
FIG. 1A is an elevation view of a chassis for an apparatus embodying the present invention.
Figure 1B:
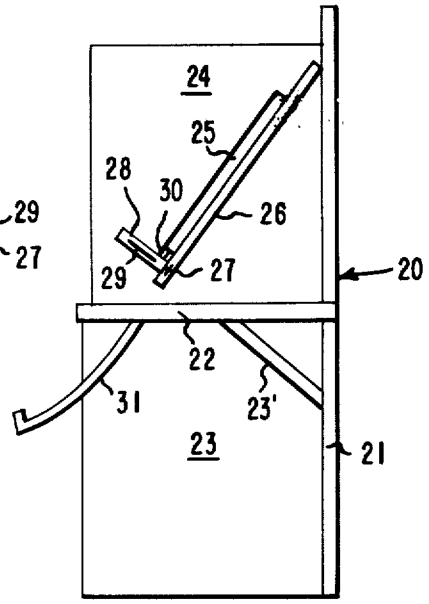
FIG. 1B is a side view of a chassis for an apparatus embodying the present invention.

Referring to the figures, FIGS. 1A and 1B illustrate a chassis for an apparatus embodying the present invention. The chassis 20 comprises an upright support 21, a bench 22 and various support braces 23 and 23'. Located on the bench 22 is a housing 24 containing the functioning parts of the apparatus. The housing 24 contains an opening 25 for introducing the sensitized element into the apparatus. Attached to the side of the housing is a stationary guide plate 26 containing a trackway 27. A feed shelf 28 with a handle 29 is slidably disposed in the trackway. Both the opening in the housing 25 and the stationary guide plate 26 are mounted at an angle relative to the horizontal, as shown. The sensitized element D is placed in the trough formed by the guide plate and the feed shelf, supported slightly above the feed shelf by protrusion 30. The sensitized element D is then inserted into the apparatus by pushing feed shelf 28 into the apparatus. In the embodiment illustrated, the stationary guide plate 26 and movable feed shelf 28 are disposed relative to heating platens 11 and 11' (shown in FIG. 2) so that movement of the feed shelf into the instrument, will automatically carry the sensitized element D to a position between the heating platens. A calibrated scale may be provided on the feed shelf for centering the sensitized elements in the platen. The heating platens are normally separated, but when the sensitized element D is in position between the platens, they close upon the sensitized element, holding it in place so that the feed shelf 28 can be withdrawn. After a sufficient heating time, the platens open and the sensitized element is fed between the nip rolls 18 and 18', by force of gravity, to finally rest at some suitable collection point such as collection tray 31, which may have a curved surface so that the sensitized element will slide on its leading and trailing edges thereby preventing damage to the image on the surface of the sensitized element.

Figure 2:
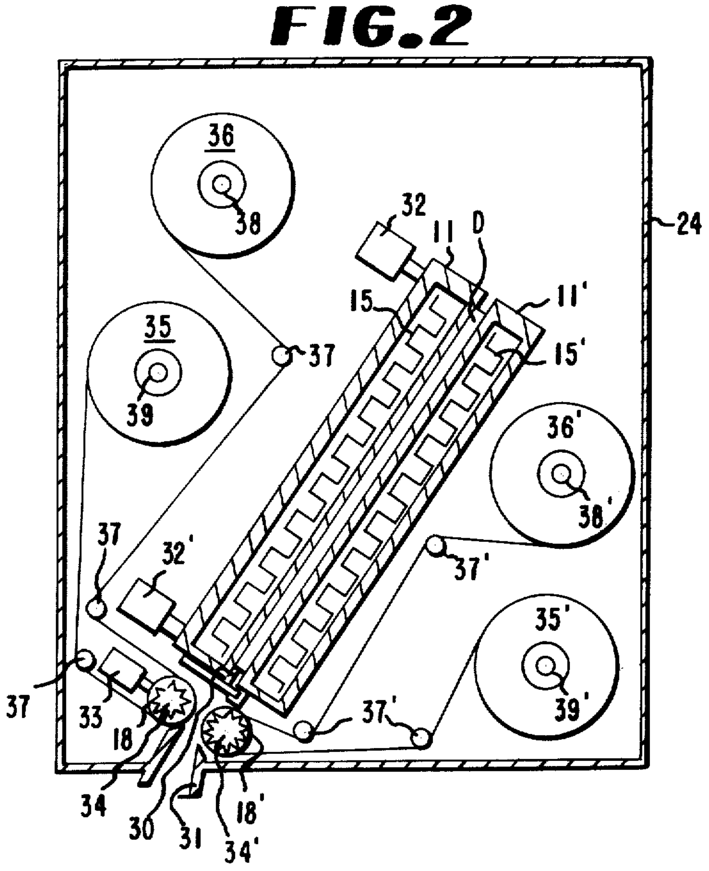
FIG. 2 is a side view in section taken along lines 2—2 of FIG. 1.

The specific operation of the apparatus can best be seen by references to FIGS. 2 and 3. The feed shelf 28 is mounted directly below heating platen 11' which is stationarily mounted in housing 24. Heating platen 11 is mounted on air pistons 32 and 32' and cooperate with the stationary platen 11' to clamp and heat a sensitized element according to the process of Assignee's aforementioned U.S. Pat. No. 3,607,264. The plates are heated by heating elements 15, 15' disposed in the platens. A limit switch (not shown), recessed in trackway 27, controls the air pistons, activating them to close the platens when the feed shelf is fully inserted in the trackway.

A pair of coacting nip rolls 18, 18' having shafts 19, 19' journaled in bearing blocks (not shown), are disposed below the platens 11, 11'. Roll 18' below platen 11' is fixedly mounted, and roll 18 is operably mounted on air pistons 33 for engaging in nip with roll 18'.

Motor 84 is activated by a photocell 16 and light source 17 which are disposed below the platens 11, 11' to detect the leading edge of a sensitized element as it emerges from between the platens after it has been heated and the platens have been disengaged releasing the element.

A variable time delay relay is provided for presetting the heating cycle time during which the sensitized element is between platens 11, 11'.

Web supply rolls 36, 36' are disposed on either side of the platens and are rotatably mounted on shafts 38, 38' journaled in bearing blocks (not shown). The supply rolls are provided with friction brakes (not shown). Web take-up rolls 35,35' are disposed on either side of the platens on shafts 39, 39' which are rotatably journaled in bearing blocks (not shown). The take-up rolls are driven by sprockets through a chain drive (not shown). Stationary web guide elements 37, 37' are provided to guide the web to and from the take-up rolls and supply rolls.

In the embodiment illustrated, the apparatus is designed for use with a sensitized element which can or should be conditioned by heating to allow for delamination and separation of the hardened and unhardened portions of the resist layer. Heating platens 11 and 11' are provided for this purpose. If a thermal adhesive is to be used to adhere the continuous web to the receptor sheet, then in one embodiment, the heat retained by the sensitized element after it has been heated by the heating platen is sufficient to activate the thermal adhesive. In a preferred embodiment, however, rolls 18, 18' are provided with heating means 34, 34' for applying heat to the continuous web. Thus rolls 18, 18' may be used to provide additional heat to activate the thermal adhesive when heating platens 11 and 11' are used to condition the sensitized element for delamination. Alternately they may be used as the sole source of heat to activate the thermal adhesive when the apparatus is to be used in accordance with the process of assignee's patent application Ser. No. 78,180, in which the receptor sheet may be delaminated from the sensitized element at room temperature, and for which the heating platens 11, 11' may be either shut off or omitted entirely.

If a pressure sensitive adhesive is to be used, then the heating means in the rolls may be shut off or omitted entirely, and, as above, if no heat is necessary to condition the sensitized element for delamination, the heating platens can also be shut off or omitted.

If the process is to be practiced in accordance with U.S. Pat. No. 3,607,264 in which the receptor sheet is delaminated at a temperature above 45°C., it is preferable to use thermal adhesive, particularly thermoplastic adhesive, and to use both heating platens and heated rolls.

In the embodiment illustrated, the adhering means used to adhere the continuous web to the receptor sheet is in the form of a pair of nip rolls. Alternatively, these nip rolls can be replaced by any suitable means for adhering the continuous web to the receptor sheet, e.g., bars or shoes which are disposed in a manner such as to engage the sensitized element and which may also contain heating elements for use with thermal adhesive.

Figure 9:
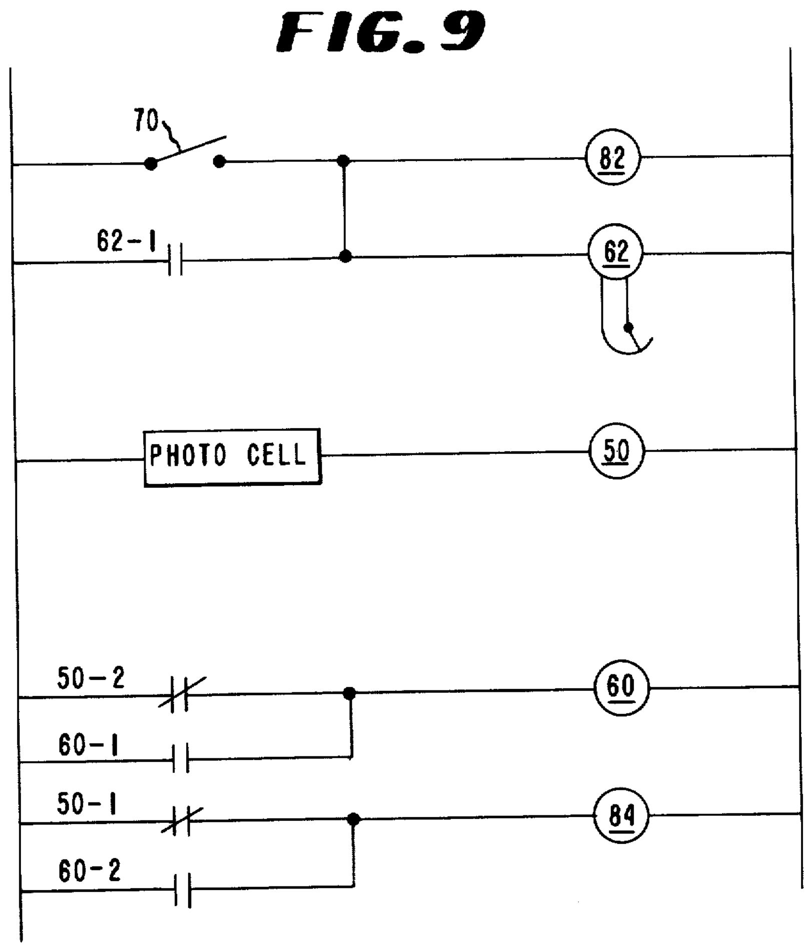
FIG. 9 is a schematic diagram of a control circuit for the embodiment of the invention shown in FIGS. 1, 2 and 3.

The automatic operation of the apparatus can best be understood with reference to the control diagram of FIG. 9. The feed shelf when fully inserted into housing 24 closes limit switch 70 in the trackway, energizing solenoid valve 82 to activate the air pistons clamping the sensitized element between platens 11, 11'. Limit switch 70 also energizes time delay relay 62. Once time delay relay 62 has been energized, one of its contacts, contact 62-1, maintains a closed circuit across limit switch 70 so that solenoid 82 remains energized during the entire heating cycle even though limit switch 70, which opens as soon as feed shelf 28 is removed from the housing, is no longer closed. After the preset heating cycle time elapses, relay 62 deenergizes, contact 62-1 is broken, solenoid 82 is deenergized, and platen 11 is disengaged. The sensitized element drops, due to gravity, towards the nip of roll 18, 18'. As it drops, the leading edge of the element interrupts the light supplied to photocell 16 by light source 17 and relay 50 is deenergized. Deenergizing relay 50 causes contact 50-1 to complete a closed circuit which energizes motor 84 used to drive the coacting nip rolls and take-up rolls, and contact 50-2 energizes the delay relay 60.

The sensitized element drops into the nip of rolls 18, 18' between the web W. The element is drawn into the nip, and the adhesive layer on the web W is adhered to the integral receptor sheet S on the element. The web W is taken up by take-up rolls 35, 35' and the receptor sheet, adhering to the web, is delaminated from the element leaving the unhardened resist areas adhering to the element and the hardened resist material adhering to the receptor sheet. The receptor sheet adhering to the web is wound up on take-up rolls 35, 35'.

As the trailing edge of the sensitized element passes the light source, photocell 16 energizes relay 50. Deenergizing relay 50 also causes contact 50-2 to complete a closed circuit. Contact 60-2 of time delay relay 60 maintains motor 84 energized until after the sensitized element is drawn through the nip rolls.

Figure 4:
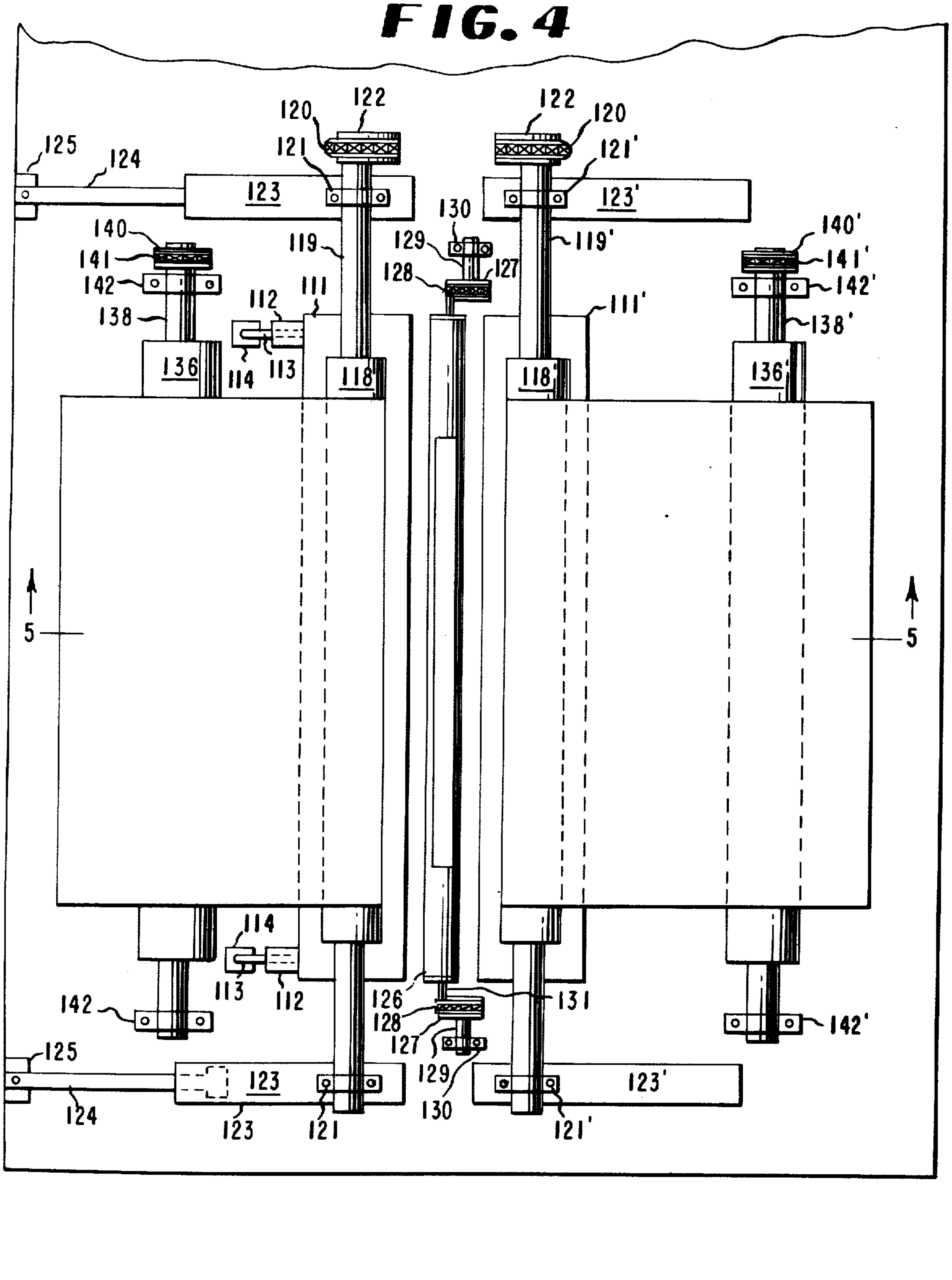
FIG. 4 is a plan view of an another apparatus embodying the present invention.

An apparatus utilizing an alternate embodiment of the invention is shown in FIGS. 4, 5 and 6. In this embodiment, platen 111 and 111' having heating elements 115 and 115' are provided for heating the sensitized element prior to delamination of the integral receptor sheet. Platen 111 is mounted on air pistons 112 which are in turn mounted on stanchions 114 through piston shaft 113. Platen 111' is fixedly mounted on stanchions (not shown). A tray 126 is disposed on shafts 131, suitably disposed on chains 128 which are operably disposed on sprockets 127 and drive sprockets (not shown), and secured from rotation by pins 132. Sprockets 127 are rotatably disposed on stub shafts 129 which are in turn mounted in brackets 130.

Roll 118 and 118' having shafts 119 and 119' are disposed above the platens and rotatably journaled in bearing blocks 121 and 121'. Bearing block 121 is in turn mounted on air piston 123 which is operably disposed on a vertical support (not shown) and connected to stanchion 125 through piston shaft 124. Roll shafts 119 and 119' have sprockets 120 and 120' and are driven by a drive sprocket (not shown) through chains 122 and 122'.

Web supply rolls 135 and 135' are disposed on either side of the platens and rotatably journaled on shafts 139 and 139'. These rolls are provided with friction brakes (not shown). Web take-up rolls 136 and 136' are disposed on either side of the platens on shafts 138 and 138' which are rotatably journaled in bearing blocks 142 and 142'. Sprockets 140 and 140' are disposed on shafts 138 and 138', and these rolls are driven by drive sprockets (not shown) through chains 141 and 141'.

A photocell 116 and light source 117 are disposed above the platens to detect the presence of a sensitized element.

Figure 11:
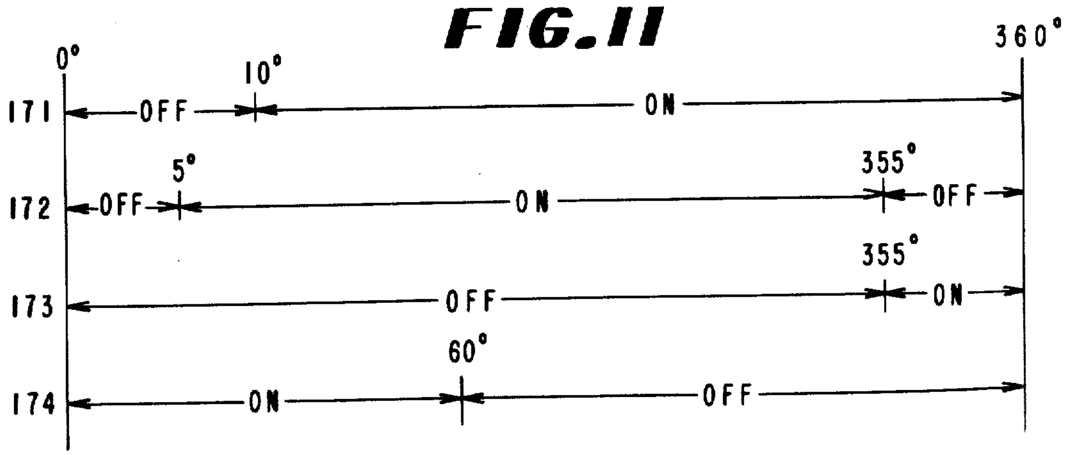
FIG. 11 is a timing diagram for the embodiment of the invention of FIGS. 4, 5, 6, 7 and 8.
Figure 10:
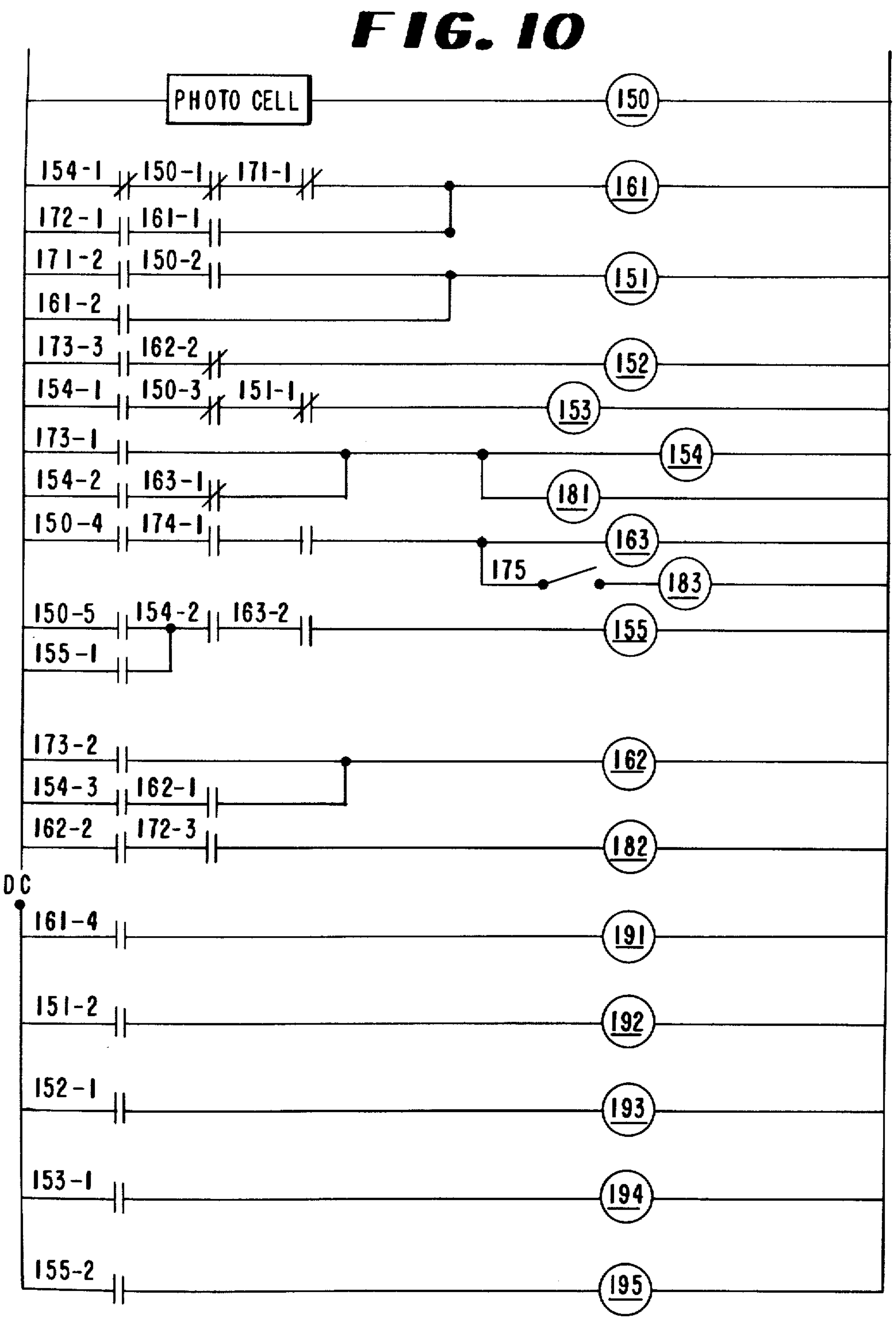
FIG. 10 is a schematic diagram of a control circuit for the embodiment of the invention of FIGS. 4, 5, 6, 7 and 8.

The operation of the apparatus can be readily understood with reference to the schematic diagram of FIG. 10 and the timing diagram of FIG. 11.

A timing gear drives a cam controlling multiple contact cam switches 171, 172, 173 and 174. The cam is geared to rotate one revolution for each cycle of the tray for the sensitized element. A cycle corresponds to the movement of the tray downward (receiving cycle) or upward (feeding cycle). The tray drive is provided with forward and reversing gears, to receive and feed the element and drive gears to perform the receiving and feeding function at fast and slow speeds. Clutches are provided to engage the reversing gear for receiving the element and for engaging the gear drives in series for the fast and slow modes.

When an element is inserted between the rolls, which are in an open position, and deposited on the tray, the light from lamp 117 to photocell 116 is broken by the leading edge of the element and relay 150 is deenergized. Time delay relay 161 is energized through normally closed contacts 154-1, 150-1 and 171-1. Time delay relay 161 is set to delay the lowering of the tray until the sensitized element is positioned as desired. On delay energization, relay contact 161-4 activates clutch 191 which engages the reversing gear drive for lowering the tray. Relay contact 161-2 energizes relay 151, and relay contact 151-2 activates clutch 192 which engages the fast drive lowering the tray. Cam switch 172 closes at 5° rotation, and contact 172-1 seals in relay 161 through contact 161-1. The tray is lowered at fast speed until the cam rotates 355° when switch 172 opens and switch 173 closes energizing time delay relay 162 through contact 173-2. Contact 172-1 deenergizes relay 161, and contact 161-4 deactivates clutch 191 which disengages the reversing gear and halts the tray drive. Relay contact 161-2 deenergizes relay 151, and contacts 151-2 deactivate clutch 192. Switch contact 173-1 energizes relay 154 and solenoid 181, which supplies air to air pistons 124 and 124' and closes rolls 118 and 118'. Relay contact 154-2 seals in relay 154 and solenoid 181 through normally closed contact 163-1. Relay contact 154-3 seals in relay 162 through its own contact 162-1. The tray drive continues to lower due to inertia and the timing cam rotates toward 360°. Switch contact 173-2 energizes solenoid 182 through contact 162-2 activating air piston 112 and closing the platens on the sensitized element. Relay 162 deenergizes after a preselected time. Contact 162-2 deenergizes solenoid 182 and the platens are opened. Relay contact 162-2 energizes relay 152 through switch contact 171-3. Relay contact 152-1 activates clutch 193 engaging the forward gear drive to raise the tray holding the sensitized element at a fast rate through the series drive engaged through clutch 192. The tray drive reverses the direction of the timing gear and rotates the cam in the opposite direction.

At 355°, rotation switch 173 opens the switch 172 closes.

The element is raised at the fast speed through the series drive until the leading edge of the element interrupts the radiation to the photocell deenergizing relay 150. Normally open contact 150-2 opens, and relay 151 drops out deenergizing clutch 192 through contact 151-2 and disengaging the fast series drive. Clutch 194 is energized through contact 153-1 to engage the slow series drive. Relay contact 150-5 energizes relay 155, through contact 154-2 and contact 163-2, which seals itself in through its own contact 155-1. Relay contact 155-2 energizes the main drive clutch 195 and engages the drive for the nip rolls 118, 118' and take-up rolls 136, 136'. The element is fed into nip rolls 118, 118' at slow speed and the continuous web W with adhesive layer A is adhered to the integral receptor sheet R on the sensitized element. The element is drawn through the coacting nip rolls and the web W is taken-up by rolls 138, 138', whereby the receptor sheet S is delaminated from the element.

At 60° rotation of the timing cam, cam switch 174 closes.

When the trailing edge of the element passes the photcell relay 150 is energized. Relay contact 150-4 energizes time delay relay 163 and solenoid 183 through cam switch 174-1.

Figure 7:
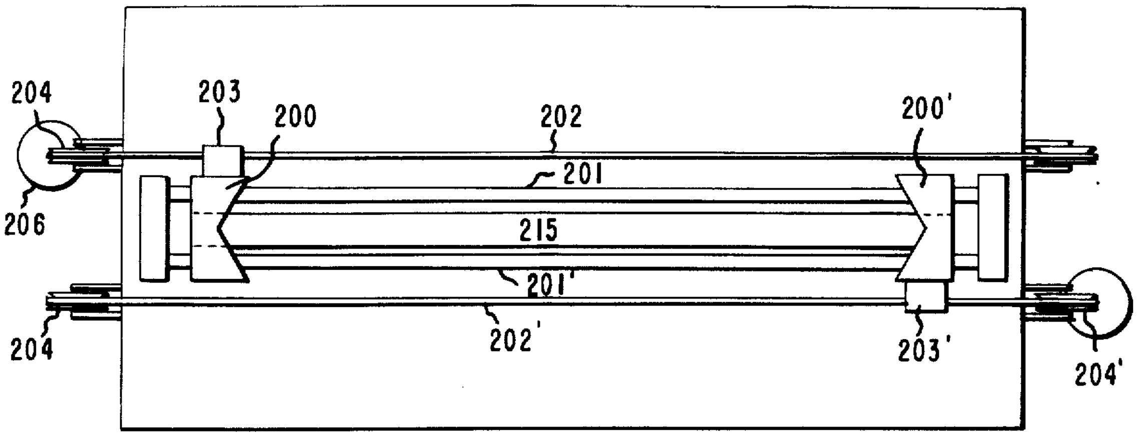
FIG. 7 is a plan view of an apparatus showing means for receiving the element in the embodiment of FIG. 4.
Figure 8:
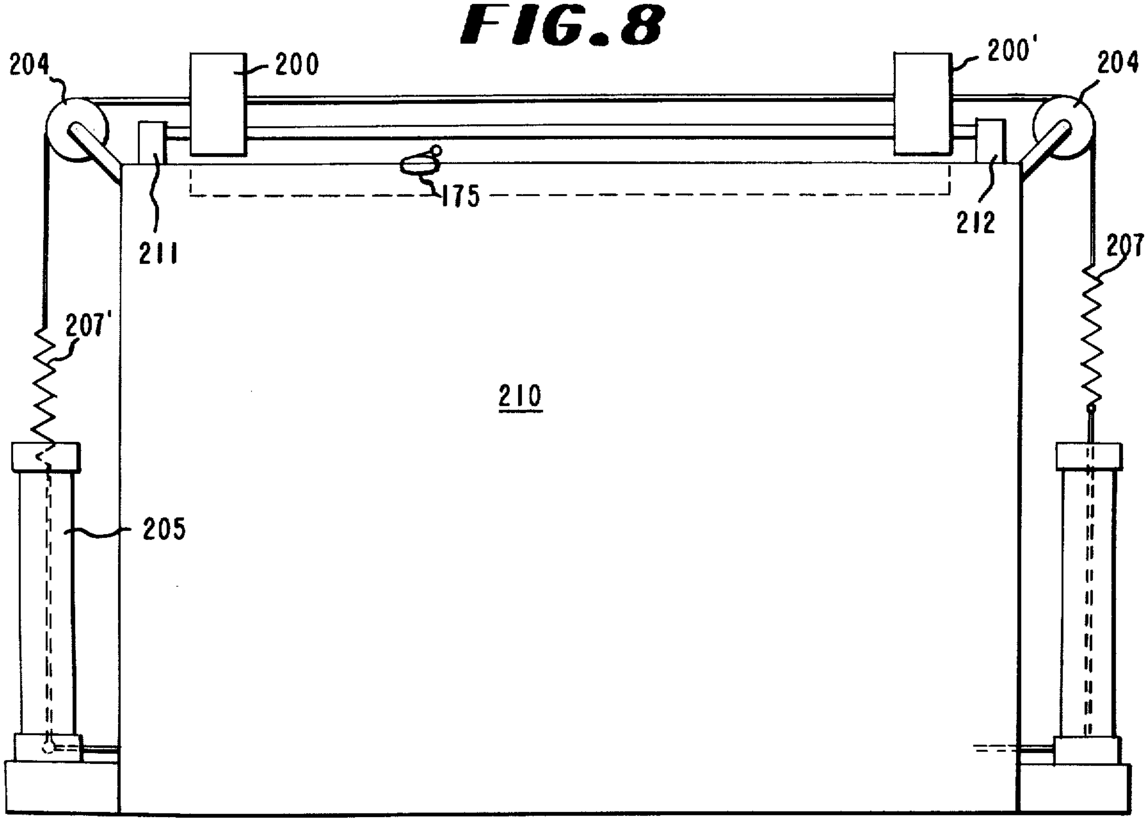
FIG. 8 is an elevation view of the apparatus of FIG. 7 showing the means for receiving the element.

FIGS. 7 and 8 illustrate a handling mechanism which may be disposed above the nip rolls to receive the element on emergence from the nip rolls and to prevent the element from falling over on to the take-up web. This article handling mechanism comprises V-faced gripping elements 200, 200', suitably disposed on shafts 201, 201', in chassis 210 housing the heating and delaminating apparatus. Cabled 202, 202', disposed in pulleys 204, are secured to the gripping elements through brackets 203, 203'. These cables operate the gripping elements through air pistons 205, 205' and springs 207, 207', to grip the sensitized element as it is fed from the apparatus through slot 215 in chassis 210.

Returning to FIGS. 10 and 11, solenoid 183 supplies air to air pistons 205, 205', and limit switch 175 is provided to deenergize the solenoid when the sensitized element is removed from the gripping means. Time delay relay 163, through relay contact 163-1 and 163-2, maintains relay 154, 155 and 156 energized until the element is free of the nip, and then relay 163 deenergizes on delay. Relays 154 and 155 drop out, opening the nip rolls, halting the take-up rolls, and disengaging the main drive clutch.

Although the apparatus described above use rolls for adhering the adhesive web to the receptor sheet on the sensitized element and platens for heating the element, other means are contemplated, e.g., nonrotatable bars or shoes are suitable for coacting to adhere the adhesive web to the receptor sheet, and heated forced air is suitable for heating the sensitized element.

A particularly useful web and adhesive layer for practicing the process of the invention at room temperature was prepared by coating a pressure sensitive adhesive of the following composition:

| | |
|---|---|
| Ethyl acrylate (88%)/Acrylic Acid (12%) Copolymer | 20 g |
| Triethylene glycol diacetate | 6 g |
| Methylene chloride | 80 g |

on a 1 mil biaxially oriented polyethylene terephthalate web using a 0.006 inch doctor knife to give an adhesive layer of 0.0008–0.001 inch thickness. The copolymer of ethyl acrylate/acrylic acid is further characterized in that it is a thermoplastic acrylic polymer having a molecular weight of approximately 260,000 and containing a number of carboxylic acid groups. This pressure sensitive adhesive web can, therefore, be used at room temperature according to assignee's aforementioned patent application Ser. No. 78,180 or at elevated temperatures according to the process of assignee's aforementioned U.S. Pat. No. 3,607,264.

Another web and adhesive layer useful for practicing the process of the invention at elevated temperatures has been found to be a 0.00075 inch biaxially oriented polyethylene terephthalate web having a polyvinylidene chloride thermoplastic coated layer. Still another suitable web and adhesive layer for practicing the process of the invention has been found to be 30 lb. kraft paper having a polyethylene thermoplastic coated layer.

Webs of other materials having the required strength and tear resistance, e.g., polycarbonate, polyethylene terephthalate co-isophthalate, are also suitable for use in the practice of the invention.

Other suitable thermoplastic adhesives include solvent soluble polyester polymers and copolymers of alkylene glycols and aromatic and aliphatic dibasic acid, e.g., terpolymers of ethylene glycol, terephthalic acid and sebacic acid of suitable melting point. Polymers of vinylidene chloride with acrylic esters, e.g., acrylonitrile, butyl acrylate et al. with or without plasticizers, e.g., dibutyl phthalate.

Suitable thermosetting adhesives include, e.g., "Epon" resin having the formula:

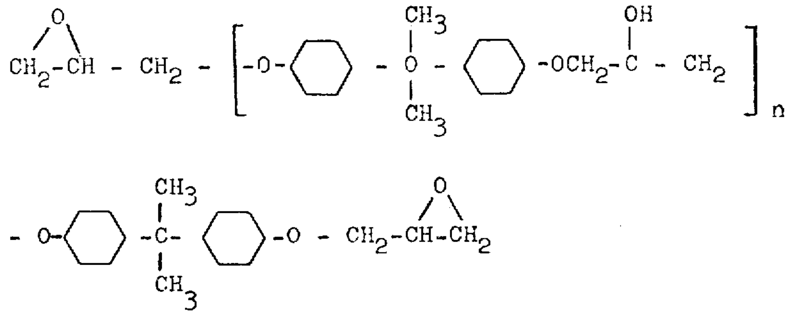

which is sold by the Shell Chemical Company. The Epon resin is further characterized by having a melting point of 75°C. and contains 1 gram equivalent of epoxide per 500 grams of resin.

Other thermoplastic and thermosetting resins having similar heat-sealable characteristics and having sufficient tackiness to adhere to the receptor sheet in the range of processing temperatures in assignee's aforementioned U.S. Pat. No. 3,607,264 are also suitable for the practice of the process of the invention. The thermal adhesives are preferred when the process and apparatus of the present invention are used in conjunction with the process of U.S. Pat. No. 3,607,264.

What is claimed is:

1. An apparatus for delaminating a receptor sheet from a discrete sheet structure comprising in combination:

a. a supply roll for a continuous web, said continuous web having an adhesive surface;

b. an element for feeding the sheet structure to said continuous web, said element including a track to move the sheet structure into position where it can be fed to said continuous web;

c. an element for adhering the adhesive surface of said continuous web to at least the leading edge of the receptor sheet by pressing the continuous web against the receptor sheet;

d. a heating element comprising at least one heating platen for heating said sheet structure before it is contacted by said continuous web; and e. a take-up roll for said continuous web and the receptor sheet, said take-up roll being disposed relative to said element for adhering said continuous web to the receptor sheet so that upon take-up of said continuous web, the receptor sheet is delaminated from the sheet structure.

2. The apparatus of claim 1 wherein said element for adhering comprises a pair of nip rolls disposed relative to said continuous web so that said continuous web is pressed against the sheet structure.

3. The apparatus of claim 1 wherein said element for adhering includes heating means for heating said continuous web so that said continuous web and the receptor sheet are adhered to one another by a thermal adhesive.

4. The apparatus of claim 1 wherein said heating element comprises a pair of heating platens and a means to clamp the sheet structure between said platens.

5. The apparatus of claim 1 wherein said element for feeding comprises means for inserting the sheet structure between said platens and means for moving the sheet structure from said platens to the nip rolls.

6. The apparatus of claim 1 comprising a pair of supply rolls and a pair of take-up rolls and in which said element for adhering comprises a pair of nip rolls for compressing each continuous web against the receptor sheet on either side of the sheet structure.

* * * * *